United States Patent [19]
Morishita et al.

[11] Patent Number: 4,520,094
[45] Date of Patent: May 28, 1985

[54] PROCESS FOR FORMING POWDER PATTERN ON LIGHT EXPOSED LAYER HAVING PHOTOSENSITIVE DIAZONIUM SALTS

[75] Inventors: Hajime Morishita; Motoo Akagi, both of Tokyo; Nobuaki Hayashi, Saitama; Saburo Nonogaki, Tokyo; Shoichi Uchino, Hachioji; Takahiro Kohashi, Kanagawa, all of Japan

[73] Assignee: Hitachi, Ltd., Tokyo, Japan

[21] Appl. No.: 435,272

[22] Filed: Oct. 19, 1982

[30] Foreign Application Priority Data

Oct. 21, 1981 [JP] Japan ................. 56-167211

[51] Int. Cl.³ ................. G03C 5/34; G03C 5/18
[52] U.S. Cl. ................. 430/144; 430/28; 430/171; 430/183
[58] Field of Search .......... 430/144, 171, 28, 183

[56] References Cited

U.S. PATENT DOCUMENTS

| 3,397,985 | 8/1968 | Hendrickx | 430/171 |
| 3,511,654 | 5/1970 | Kishida et al. | 430/144 |
| 3,970,460 | 7/1976 | Jagrovic | 430/171 |
| 4,247,612 | 1/1981 | Nishizawa et al. | 430/144 |
| 4,273,842 | 6/1981 | Nonogaki et al. | 430/28 |
| 4,409,313 | 10/1983 | Morishita et al. | 430/144 |

OTHER PUBLICATIONS

Kosar, J., "Light-Sensitive Systems", J. Wiley & Sons, 1965, pp. 194, 196, 197, 210 and 212.

Primary Examiner—Charles L. Bowers, Jr.
Attorney, Agent, or Firm—Antonelli, Terry & Wands

[57] ABSTRACT

A photosensitive composition turning shicky by light exposure, which comprises a salt or p-aminobenzenediazonium compound and at least one of salts of o- and m-aminobenzenediazonium compounds, has a distinguished effect in forming a phosphor screen of a color picture tube.

4 Claims, No Drawings

PROCESS FOR FORMING POWDER PATTERN ON LIGHT EXPOSED LAYER HAVING PHOTOSENSITIVE DIAZONIUM SALTS

BACKGROUND OF THE INVENTION

This invention relates to a photosensitive composition and a process for forming a pattern with the composition.

The inside surface of a face plate of a color picture tube is coated with three kinds of phosphors either dot-wise or stripe-wise. According to the conventional process the phosphors are coated as follows: a mixture of a first phosphor and a photosensitive resin is at first applied to the inside surface of a face plate and dried to form a coating. Then, the coating is irradiated with an ultraviolet ray through shadow mask openings. The positions of the ultraviolet irradiation correspond to the positions which electron beams hit to cause the phosphor to emit light, that is, to the positions at which the phosphor is fixed. The irradiated photosensitive resin is insolubilized due to the irradiation, and the coating at all those positions is insolubilized thereby. Then, the coating is washed with a solvent to retain only the insolubilized portions on the face plate and remove other portions by dissolution. Then, the similar treatment is carried out with a mixture of a second phosphor and a photosensitive resin, and then with a mixture of a third phosphor and a photosensitive resin.

As is obvious from the foregoing, a process for preparing the phosphor screen of a color picture tube requires repetitions of a series of wet applications, water washing and drying, and thus is complicated. Its simplication has been very keenly desired.

To this end, some of the present inventors proposed a process for forming a phosphor screen involving considerably simpler steps than before [see particularly Japanese Patent Application Kokai (laid-open) No. 126861/78], which was established on the basis of a new finding that a photolytic product of an aromatic diazonium salt has a capacity to accept power particles. The process is characterized by (1) applying a photosensitive composition that contains an aromatic diazonium salt as a photosensitive component and that turns sticky by light exposure to a substrate surface to obtain a thin layer, (2) subjecting the thin layer to a pattern wise light exposure to turn the exposed portions sticky, and (3) contacting the light-exposed thin layer with power particles to allow the thin layer to accept the powder particles, where only repetitions of light exposure and contacting with powder particles suffice for the second and third phosphors and once a coating is formed patterns of any kind of phosphor can be obtained.

However, the sensitivity of the photosensitive component of the process is somewhat lower than that of the conventional photosensitive resin, and thus the process has the problem of a prolonged treating time.

SUMMARY OF THE INVENTION

An object of the present invention is to provide a highly photosensitive composition for use in a process for forming a pattern and a process for forming a pattern with the same composition.

This and other objects of the present invention can be attained with a photosensitive composition comprising a salt of a p-aminobenzenediazonium compound and at least one of a salt of o-aminobenzenediazonium compound and a salt of m-aminobenzenediazonium compound and also by a process for forming a pattern with the composition.

The aromatic diazonium salts so far used in the heretofore described process for forming a pattern are mainly salts of p-aminibenzenediazonium compounds, for example, a double salt of 4-(dimethylamino)benzenediazonium chloride zinc chloride, a double salt of 4-(n-ethyl-N-hydroxyethylamino)benzenediazonium chloride-zinc chloride, 4-(dimethylamino)benzenediazonium borofluoride, etc. In addition, diazonium salts having no amino groups, for example, a double salt of 2-methoxy-4-nitrobenzenediazonium chloride-zinc chloride, etc. have been used.

On the other hand, neither salts of o-aminobenzenediazonium compound nor salts of m-aminobenzenediazonium compound have been used, because of a low photosensitivity and a poor crystallizability. The crystallizability of a salt is an important factor for the following reason. A coating of a photosensitive composition, unless crystallized, can accept more or less powder particles even at the light-unexposed portions. That is, a phenomenon of the so-called fogging appears. Thus, it is preferable to use a diazonium salt with a good crystalizability.

It has been found that a photosensitivity is much more improved by simultaneous use of a salt of p-aminobenzenediazonium compound and at least one of the salts of o- and m-aminobenzenediazonium compounds; although these salts have a low photosensitivity by themselves as described above, as compared to the single use of a salt of p-aminobenzenediazonium compound. Too much simultaneous use of at least one of salts of o- and m-aminobenzenediazonium compounds, of course, reduce the photosensitivity. On the other hand, a practically equivalent crystallizability as achieved by the single use of a salt of p-aminobenzenediazonium can be obtained by simultaneous use of a small amount of at least one of the salts of the o- and m-aminobenzenediazonium compounds, but the crystallizability is gradually lowered with an increasing amount thereof. That is, when the amount of at least one of the salts of o- and m-aminobenzenediazonium compounds exceeds 200% by weight on the basis of p-aminobenzenediazonium compound, the photosensitivity and also the crystallizability of a resulting composition will be much lowered. In some cases, no substantial effect upon the increase in photosensitivity is observed when the amount of at least one of the salts of o- and m-aminobenzenediazonium compounds exceeds 100% by weight, though this depends upon the species of a diazonium compound and the salts to be used, a combination thereof, and species and amount of a polymer compound to be added to make a coating, which will be described later. The crystallizability is also lowered. For example, no crystallization takes place in some cases without allowing the coating to be left standing 20–30 minutes after the coating as applied.

On the other hand, an effect upon the increase in the photosensitivity is observable to some extent, when at least 1% by weight of at least one of the salts of o- and m-aminobenzenediazonium compounds is used together with a salt of p-aminobenzenediazonium compound. Simultaneous use of at least 3% by weight of the former has a large effect. Thus, a range for at least one of the salts of o- and m-aminobenzenediazonium compounds is preferably 1–200% by weight, more preferably 3–100% by weight. The most preferable range, which has a practically remarkable effect upon the increase in the photosensitivity wihtout considerable reduction in crystallizability, is 5-50% by weight.

It is also preferable to use both o- and m-aminobenzenediazonium compounds in a mixture.

The salts of o- and m-aminobenzenediazonium compounds for use in the present invention include, for example, salts of compounds represented by the following general formula:

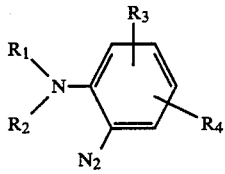
(I)

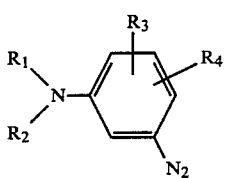
(II)

wherein $R_1$ and $R_2$ represent straight alkyl groups or H, but do not represent H at the same time, and $R_3$ and $R_4$ represent H, straight alkyl groups and alkoxy group.

When $R_1$ and $R_2$ represent straight alkyl groups and $R_3$ and $R_4$ represent straight alkyl groups or alkoxy groups, the groups have preferably not more than two carbon atoms, more preferably one carbon atom, that is, the groups are more preferably the methyl group and the methoxy group. If the group have 3 or more carbon atoms, the crystallizability of the salts is lowered. The methyl group and the methoxy group give the most distinguished crystallizability to the salts.

Salts of compounds taking other substituents than H at three adjacent positions of the benzene ring, for example, salts of the compound represented by the general formula (II) taking an alkyl or alkoxy group at the position between-$N_2$ and

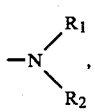

such as 2-ethyl-3-(diethylamino)benzenediazonium salts, etc. are not preferable because of a storage problem, for the diazonium salts are readily decomposable.

The salts include, for example, a double salts of chloride.zinc chloride (Cl.nZniCl$_2$ where n is 1 or ½), borofluoride (BF$_4$), hydrogen sulfate (HSO$_4$), etc., among which the double salts of chloride.zinc chloride are preferable owing to their distinguished crystalizability.

The diazonium salts include, for example:
double salt of 4-methoxy-5-(dimethylamino)benzenediazonium chloride.zinc chloride

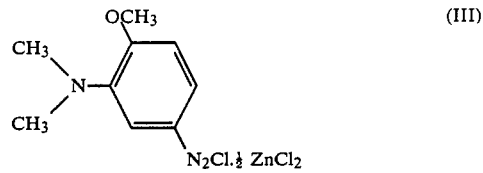
(III)

double salt of 4-methyl-5-(dimethylamino)benzenediazonium chloride.zinc chloride

(IV)

double salt of 3-methoxy-6-(dimethylamino)benzenediazonium chloride.zinc chloride

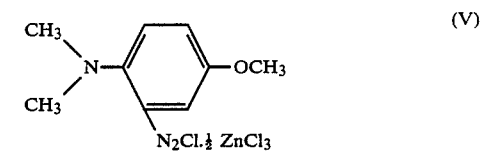
(V)

double salt of 4-methoxy-6-(dimethylamino)benzenediazonium chloride.zinc chloride

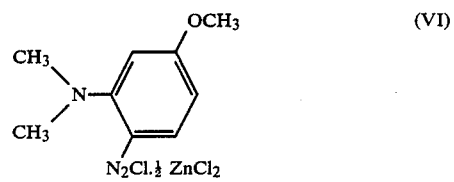
(VI)

in addition to these N,N-dimethyl compound, N,N-diethyl compound, N-methyl compounds, etc. can be used. In addition, the following double salts can be also used: double salt of 2-(dimethylamino)benzenediazonium chloride.zinc chloride, double salt of 3-(dimethylamino)benzenediazonium chloride.zinc chloride, double salt of 2-methoxy-5-(dimethylamino)-benzenediazonium chloride.zinc chloride, double salt of 4-methoxy-6-(dimethylamino)benzenediazonium chloride.zinc chloride, double salt of 4-methyl-6-(dimethylamino)benzenediazonium chloride.zinc chloride, double salt of 3,4-dimethyl-6-(dimethylamino)benzenediazonium chloride.zinc chloride, double salt of 4-methyl-6-(methylamino)benzenediazonium chloride.zinc chloride, etc.

The same thing is true of the carbon number of the substituent groups for p-aminobenzenediazonium compound. That is, salts of N,N-dimethyl and N-methyl compounds are most preferable, and salts of N,N-diethyl and N-ethyl-N-methyl compound are preferable as next thereto. When the benzene ring has an alkyl group or an alkoxy group, the groups have preferably not more than 2 carbon atoms, most preferably one carbon atoms. Examples of such diazonium compounds include double salts of aromatic diazonium compound chloride.zinc chloride such as double salt of 4-(dimethylamino)benzenediazonium chloride.zinc chloride, double salt of 4-(diethylamino)benzenediazonium chloride.zinc chloride, double salt of 4-(N-ethyl-N-hydroxyethylamino)benzenediazonium chloride.zinc chloride, etc. and aromatic diazonium tetrafluoroborate such as 4-(dimethylamino)benzenediazonium borofluoride, and aromatic diazonium hydrogen sulfate such as 4-(dimethylamino)benzenediazonium sulfate, 4-(phenylamino)-benzenediazonium sulfate, etc., among which double salt of 4-(dimethylamino)benzenediazonium chloride.zinc chloride is most preferable owing to distinguished crystallizability.

It is also possible to further and other aromatic diazonium salt than the salts of o-, m- and p-aminobenzenediazonium compounds. For example, said double salt of 2-methoxy-4-nitrobenzenediazonium chloride.zinc chloride, etc. can be used. However, these salts generally have a poor crystallizability, and not more than 10% by weight thereof is preferably used on the basis of said salts of o-, m-, and p-compounds.

To improve the applicability of the present photosensitive composition as a thin layer, at least one of an organic polymer compound and a surfactant as disclosed in Japanese Patent Application Kokai (Laid-open) No. 126861/78 can be preferably added to the present photosensitive composition. The organic polymer compound includes, for example, gum arabic, polyvinyl alcohol, polyacrylamido, poly-N-vinylpyrolidone, hydroxypropylmethyl cellulose, alginic acid, propyleneglycol ester of alginic acid, acrylamide.-diacetoneacrylamide copolymer, methylvinyl ether.-maleic anhydride copolymer, etc., and 0.5–500% by weight, preferably 1–100% by weight, of the organic polymer compound is used on the basis of total of the salts of the aromatic diazonium compounds. On the other hand, about 0.01—about 1% by weight of the surfactant is used on the basis of total of the salts of the aromatic diazonium compounds.

PREFERRED EMBODIMENTS OF THE INVENTION

The present invention will be described in detail below, referring to Examples. First of all, examples of synthesizing the compounds shown by the general formulae will be described.

SYNTHESIS EXAMPLE 1

Synthesis of double salt of 4-methoxy-5-(dimethylamino)benzenediazonium chloride.zinc chloride (formula III):

50 g of O-anisidine is suspended in 100 g of water, and 133 g of dimethyl sulfate is added thereto dropwise while keeping the mixture at 18° C. or less. Then, 170 g of 30% sodium hydroxide is added thereto to dimethylize the amino group. 30 g of the resulting N,N-dimethyl-O-anisidine is dissolved in hydrochloric acid, and then 65 g of an aqueous 30% sodium nitrite solution is added thereto dropwise while keeping the mixture at 15° C. or less to obtain 5-nitroso-2-methoxy-N,N-dimethylaniline. Then, the product is reduced, and then diazonized with sodium nitrate under a hydrochloric acid-acidified state according to the conventional process. Then, a double mole of an aqueous zinc chloride solution is added thereto to obtain a double salt of zinc chloride. The double salt is recrystallizable from dilute hydrochloric acid and is found to be the compound of formula III from the following analytical values:

Infrared spectroscopic absorption (KBr tablet): 2160 cm$^{-1}$ (5N=N), 1520 and 1570 cm$^{-1}$ ($\nu$C=C), 1370 cm$^{-1}$ ($\nu$C=N), 860 and 800 cm$^{-1}$ (substituted aromatic ring).

Ultraviolet spectroscopic absorption: maximum absorption wavelength; 405 nm.

Molecular extinction coefficient: $3.0 \times 10^4$.

Zinc analysis (atomic absorption spectroanalysis): 11.6% (calculated: 11.6%).

SYNTHESIS EXAMPLES 2 AND 3

Synthesis of double salt of 4-methyl-5-(dimethylamino)benzenediazonium chloride.zinc chloride (Formula IV) and double salt of 4-methyl-5-(methylamino)benzenediazonium chloride.zinc chloride:

25 g of 2-methyl-5-nitroaniline is treated in 50 ml of dimethyl sulfate at 90° C. for 10 minutes, and then the reaction mixture is cooled, and admixed with 50 ml of cold water. Then, 85 g of 30% NaOH is added thereto to methylize the amino group. After the reduction, the dimethyl compound are separated from the monomethyl compound in a ratio of about 8:2 by distillation. Yield in total of these compounds is about 80%. The compounds are separately diazonized with sodium nitrite in a hydrochloric acid-acidified state according to the conventional process, and then a double mole of an aqueous zinc chloride solution is added to each of the reaction mixtures to obtain double salts of zinc chloride each.

Other diazonium salts can be synthesized in the same manner as above with the corresponding starting materials.

The well known diazo compounds, for example, 3,4-dimethyl-6-(dimethylamino)benzenediazonium chloride, disclosed in Kosar: Light-sensitive systems, John Wiley & Sons, Inc (1965), can be likewise synthesized to obtain double salts of zinc chloride with an aqueous zinc chloride solution.

EXAMPLE 1

One part by weight of double salt of 4-methoxy-5-(dimethylamino)benzenediazonium chloride.zinc chloride (Formula III) and 9 parts by weight of double salt of 4-(dimethylamino)benzenediazonium chloride.zinc chloride are mixed together, and then an aqueous 0.5% propyleneglycol alginate solution is added to the mixture to make 10% by weight of the solid matters on the total of the diazonium compounds. The resulting composition is applied to a glass substrate by a spinner, and dried to obtain a crystallized coating having a thickness of about 0.5 $\mu$m. The coating is subjected to irradiation by a 500 W ultrahigh pressure mercury lamp placed at a distance 135 cm through a shadow mask for 170 seconds, and the light-exposed parts can be coated with phosphor powder.

On the other hand, a comparative coating is prepared in the same manner as above without using the compound of formula III, that is, with only 4-(dimethylamino)benzenediazonium chloride.zinc chloride and propyleneglycol alginate. A substantially equal amount of the phosphor powder can be deposited after irradiation for 250 seconds.

EXAMPLES 2–4

Similar coatings are prepared in the same manner as in Example 1 except that the diazonium salts of Formula IV, V and VI are used in place of the diazonium salt of Formula III of Example 1.

Ratio by weight thereof to the double salt of 4-(dimethylamino)benzenediazonium chloride.zinc chloride is the same 1:9 as in Example 1. Light exposure time for depositing the substantially equal amount of phosphor powder is shown in the following Table.

TABLE

| Example No. | Diazonium salt | Light exposure time |
| --- | --- | --- |
| 2 | Formula IV | 200 seconds |
| 3 | Formula V | 170 seconds |
| 4 | Formula VI | 170 seconds |

EXAMPLE 5

Coating is prepared in the same manner as in Example 1 except that 0.5 parts by weight of the diazonium salt of Formula III, 0.5 parts by weight of the diazonium salt of Formula VI, and 9 parts by weight of double salt of 4-(dimethylamino)benzenediazonium chloride.zinc chloride are used. Light exposure time for depositing the substantially equal amount of phosphor powder is 150 seconds.

EXAMPLE 6

Coating is prepared in the same manner as in Example 2 except that the salt of monomethyl compound synthesized in Synthesis Example 3 is used, and the substantially equal result can be obtained.

EXAMPLE 7

Coating is prepared in the same manner as in Example 1 except that the double salt of 4-(dimethylamino)benzenediazonium chloride.zinc chloride and 5% by weight of the diazonium salt of Formula III on the basis of the former salt are used. The substantially same amount of phosphor powder as in Example 1 can be deposited with the light exposure time of 210 seconds.

EXAMPLE 8

Coating is prepared in the same manner as in Example 1 except that the double salt of 4-(dimethylamino)-benzenediazonium chloride.zinc chloride and 50% by weight of the diazonium salt of Formula III on the basis of the former salt are used. It takes a little more time in crystallization, but the substantially same photosensitivity as in Example 1 can be obtained.

What is claimed is:

1. A process for forming a pattern of powder on a coating layer, which comprises a step of applying a photosensitive composition comprising a 4-(dimethylamino)benzenediazonium salt and at least one salt of o- and m-aminobenzenediazonium compounds selected from the group consisting of 4-alkoxy-5-(dimethylamino)benzenediazonium salt, 4-alkyl-5-(dimethylamino)benzenediazonium salt, 3-alkoxy-6-(dimethylamino)benzenediazonium salt, 4-alkoxy-6-(dimethylamino)benzenediazonium salt and 4-alkyl-5-(methylamino)benzenediazonium salt wherein the carbon atom number in alkyl groups and alkoxy groups in said salts is 2 or less, said composition containing 1-200% by weight of at least one of the salts of the o- and m-aminobenzenediazonium compounds on the basis of the 4-(dimethylamino)benzenediazonium salt, to a substrate thereby forming a thin layer, a step of subjecting the thin layer to patternwise light exposure to make the exposed portions of the layer sticky, and a step of contacting the light-exposed thin layer with powder particles, thereby depositing the powder particles to light-exposed portions of said thin layer.

2. The process according to claim 1, wherein 0.5-500% by weight of an organic polymer compound is further contained on the basis of the total of the aromatic diazonium compound.

3. The process according to claim 2, wherein the organic polymer compound is selected from the group consisting of gum arabic, polyvinyl alcohol, polyacrylamino, poly-N-vinylpyrolidone, hydroxypropylmethyl cellulose, alginic acid, a propyleneglycol ester of alginic acid, an acrylamide.diacetoneacrylamide copolymer, and a methylvinyl ether.maleic anhydride copolymer.

4. The process according to claim 1, wherein the salt of o- and m-aminobenzenediazonium compounds is selected from the group consisting of 4-methoxy-5-(dimethylamino)benzenediazonium salt, 4-methyl-5-(dimethylamino)benzenediazonium salt, 3-methoxy-6-(dimethylamino)benzenediazonium salt, 4-methoxy-6-(dimethylamino)benzenediazonium salt and 4-methyl-5-(methylamino)benzenediazonium salt.

* * * * *